(12) United States Patent
Drexel et al.

(10) Patent No.: US 10,446,360 B2
(45) Date of Patent: Oct. 15, 2019

(54) PARTICLE SOURCE FOR PRODUCING A PARTICLE BEAM AND PARTICLE-OPTICAL APPARATUS

(71) Applicant: Carl Zeiss Microscopy GmbH, Jena (DE)

(72) Inventors: Volker Drexel, Koenigsbronn (DE); Bernd Hafner, Abtsgmuend (DE)

(73) Assignee: Carl Zeiss Microscopy GmbH (DE)

( * ) Notice: Subject to any disclaimer, the term of this patent is extended or adjusted under 35 U.S.C. 154(b) by 0 days.

(21) Appl. No.: 15/975,959

(22) Filed: May 10, 2018

(65) Prior Publication Data
US 2018/0330912 A1 Nov. 15, 2018

(30) Foreign Application Priority Data
May 11, 2017 (DE) .......................... 10 2017 208 005

(51) Int. Cl.
*H01J 37/147* (2006.01)
*H01J 37/09* (2006.01)
*H01J 37/10* (2006.01)
*H01J 37/26* (2006.01)

(52) U.S. Cl.
CPC .......... *H01J 37/1472* (2013.01); *H01J 37/09* (2013.01); *H01J 37/10* (2013.01); *H01J 37/26* (2013.01); *H01J 2237/0453* (2013.01); *H01J 2237/152* (2013.01)

(58) Field of Classification Search
CPC ........ H01J 37/1472; H01J 37/09; H01J 37/10; H01J 37/26; H01J 2237/0453; H01J 2237/152

USPC .... 250/396 R, 397, 306, 307, 309, 310, 311, 250/492.1, 492.2, 492.21, 492.22, 492.23, 250/492.3
See application file for complete search history.

(56) References Cited

U.S. PATENT DOCUMENTS

| | | | |
|---|---|---|---|
| 7,034,315 B2 | 4/2006 | Henstra et al. | |
| 7,999,225 B2 | 8/2011 | Henstra | |
| 8,461,525 B2 | 6/2013 | Henstra | |
| 8,710,452 B2 | 4/2014 | Henstra | |
| 2002/0130262 A1* | 9/2002 | Nakasuji | G01N 23/225 250/311 |
| 2005/0178982 A1 | 8/2005 | Henstra et al. | |

(Continued)

OTHER PUBLICATIONS

German Office Action, with translation thereof, for corresponding DE application No. 10 2017 208 005.1 dated Oct. 30, 2017.

*Primary Examiner* — Nicole M Ippolito
(74) *Attorney, Agent, or Firm* — Fish & Richardson P.C.

(57) ABSTRACT

A particle source for producing a particle beam includes a particle emitter, a first plate, a first deflector and a second plate with an aperture. The first plate has a smaller aperture, downstream of which a first beam is formed, and a larger aperture, downstream of which a second beam is formed. A controller sets the deflection angle of the deflector so that in a first mode of operation that particles of the first beam pass through the aperture in the second plate and form the particle beam produced by the particle source. The controller sets the deflection angle so that in a second mode of operation that particles of the second beam pass through the aperture in the second plate and form the particle beam produced by the particle source.

20 Claims, 8 Drawing Sheets

(56) References Cited

U.S. PATENT DOCUMENTS

| | | | |
|---|---|---|---|
| 2010/0072403 A1* | 3/2010 | Abe | B82Y 10/00 |
| | | | 250/492.22 |
| 2012/0112090 A1 | 5/2012 | Henstra | |
| 2012/0261565 A1 | 10/2012 | Tuggle et al. | |
| 2014/0231668 A1* | 8/2014 | Yasuda | B82Y 40/00 |
| | | | 250/396 R |
| 2014/0367586 A1 | 12/2014 | Frosien et al. | |
| 2015/0332890 A1* | 11/2015 | Matsui | H01J 37/3026 |
| | | | 250/396 R |
| 2018/0138012 A1* | 5/2018 | Iizuka | H01J 37/045 |
| 2018/0166248 A1* | 6/2018 | Ogasawara | H01J 37/04 |

\* cited by examiner

PARTICLE SOURCE FOR PRODUCING A PARTICLE BEAM AND PARTICLE-OPTICAL APPARATUS

CROSS-REFERENCE TO RELATED APPLICATION

The present application is a continuation of, and claims benefit under 35 USC 119 of German Application No. 10 2017 208 005.1, filed May 11, 2017. The entire disclosure of this application is incorporated by reference herein.

FIELD

The disclosure relates to a particle source for producing a particle beam and a particle-optical apparatus. In particular, the disclosure relates to a particle source for producing a beam of charged particles for operation of a particle-optical apparatus, such as, e.g., an electron microscope, an ion microscope or a lithography appliance. The disclosure further relates to a particle-optical apparatus that includes such a particle source.

BACKGROUND

By way of example, a particle source that produces an electron beam is used in a scanning electron microscope, the electron beam being focussed on the surface of an object to be examined, wherein the location of the focus, i.e. the location at which the electrons are incident on the object, is scanned step-by-step over the surface of the object by deflecting the electron beam. The focus remains at each location for a period of time that is sufficient to be able to detect a desired number of events that are triggered by electrons incident on the object. By way of example, the events can be secondary electrons, x-ray radiation or other types of events that are triggered by an electron incident on the object. The detected events that are assigned to the various locations of the object represent an electron-microscopic image of the object. In order to be able to record an image with a desired contrast, it is desirable to detect a sufficient number of events, for the purposes of which a minimum number of electrons is incident at each location on the object. This minimum number depends on the properties of the object, the type of detected event, the noise of detectors and other components, and further factors.

Therefore, within the scope of increasing a throughput when obtaining electron-microscopic images, it is desirable for the particle beam that is directed onto the object to have a beam current that is as high as possible. However, an increase of the beam current in a given scanning electron microscope leads to an increase in a diameter of the beam focus that can be produced at the surface of the object by way of the scanning electron microscope since the charged particles in the beam interact with one another. The resolution of the scanning electron microscope is restricted by the diameter of the beam focus. Consequently, within the scope of increasing the resolution, it is desirable, on the other hand, to reduce the beam current.

Consequently, in the case of a given scanning electron microscope, it is possible to increase the throughput to the detriment of the resolution or it is possible to increase the resolution to the detriment of the throughput.

In a typical scanning electron microscope, the maximum size of the beam current is determined by the size of the cross-sectional area of an aperture in an anode stop that defines the beam. Increasing the cross-sectional area of the aperture leads to an increase in the maximum possible beam current. Therefore, anode stops with differently large apertures are obtainable for the typical scanning electron microscope in order to be able to change the maximum beam current by interchanging the anode stops. However, interchanging the anode stops, which are arranged in a vacuum during the operation of the scanning electron microscope, is a complicated process involving much time. Therefore, use is often made of two scanning electron microscopes, possibly even of the same design, in laboratories, the scanning electron microscopes differing in view of the produced beam current in order to be able to alternatively examine specimens at a high beam current with a high throughput and at a low beam current with a high resolution. It is clear that the procurement of two scanning electron microscopes merely for the purpose of being able to carry out examinations with two different beam currents is considered to be unsatisfactory.

SUMMARY

The disclosure proposes a particle beam system and a particle source which facilitate a change in the maximum possible beam current in a comparatively simple manner.

According to an embodiment of the disclosure, a particle source for producing a particle beam includes a controller, a particle emitter, a first plate with at least two apertures, a first deflector and a second plate with one aperture. The particle emitter is configured to produce a diverging beam of charged particles. The charged particles can be electrons or ions, for example. The divergent beam of charged particles produced by the particle emitter is incident on the first plate and the at least two apertures in the first plate. The at least two apertures differ in terms of their cross-sectional area. A first of the at least two apertures in the first plate has a smaller cross-sectional area than a second of the at least two apertures in the first plate. The apertures may have a circular form, although this is not necessary. By way of example, one or more of the apertures may have a form that corresponds to a part of a circular ring. Together, a plurality of such apertures can provide a cross-sectional area that approximates the cross-sectional area of a circular ring. The cross sectional area of the second aperture can be more than 1.2 times, more than 1.5 times, more than two times, more than five times and more than ten times larger, for example, than the cross-sectional area of the first aperture. The particles of the divergent beam can pass through the first plate through the apertures in the first plate. The apertures are arranged at a distance from one another such that a plurality of particle beams that are separated from one another are formed in the beam path of the particles downstream of the first plate, wherein the cross-sectional area of each aperture also determines the cross section of the particle beam formed by this aperture. Under the assumption that the density of the particles in the divergent beam incident on the first plate is substantially constant in the region of the apertures, then, for example, the beam currents of beams that are formed by two apertures whose cross-sectional areas differ by a factor of 2, for example, likewise differ by two times the amount.

The particle beams formed by the apertures in the first plate are incident on the second plate. An aperture through which particles can pass through the second plate is provided in the second plate. The first deflector is arranged in the beam path between the first plate and the second plate. The first deflector provides a field that deflects the particles. By way of example, this field can be an electric or magnetic dipole field. This deflecting field acts over an extended range in the direction of the beam on the particles of the particle beam passing through the deflector. The extent of the deflecting field is attributable to the constructional boundary conditions of the deflector, such as the geometry of the coils for producing a magnetic dipole field, for example. As seen in the beam direction, the deflecting field has a maximum at a certain location and this location can be defined as the principal plane of the deflector. Consequently, the principal plane of the first deflector is arranged between the first plate and the second plate.

The first deflector deflects the particles of the particle beam passing through the deflector. The controller is configured to set the extent of this deflection, for example by setting a current that is supplied to coils of the deflector in order to produce a deflecting magnetic field.

The controller has a first and a second mode of operation. In the first mode of operation, the controller sets the deflection in such a way that particles of the first beam pass through the aperture in the second plate and the particles of the second beam are incident on the second plate, without passing through the latter. Depending on the size and positioning of the cross-sectional area of the aperture in the second plate, all particles of the first beam or some of these particles pass through the second plate and form the particle beam produced by the particle source in the first mode of operation.

In the second mode of operation, the controller sets the deflection in such a way that particles of the second beam pass through the aperture in the second plate and the particles of the first beam are incident on the second plate, without passing through the latter. Some of the particles or all particles of the second beam consequently pass through the opening in the second plate and form the particle beam produced by the particle source in the second mode of operation. Since the first and the second beam differ in terms of their beam current, the particle source consequently produces a particle beam with a first beam current in the first mode of operation and a particle beam with a second beam current that is greater than the first beam current in the second mode of operation. Switching between the first mode of operation and the second mode of operation takes place by changing the first deflection angle produced by the first deflector. Consequently, the beam current can be changed purely by switching a mode of operation with the aid of a controller, without having to replace anode stops, in a particle-optical apparatus that uses this particle source.

According to exemplary embodiments, the first deflector provides an electric and/or magnetic dipole field in order to deflect the first beam and the second beam together through a first deflection angle (a).

According to exemplary embodiments, the particle source includes a second deflector that is arranged downstream of the first deflector in the beam path and configured to deflect the particles of the first and the second beam by an adjustable second deflection angle. Once again, the second deflector is arranged downstream of the first deflector in the sense that a principal plane of the second deflector is arranged in the beam path downstream of the principal plane of the first deflector. According to exemplary embodiments herein, the controller is further configured to set the second deflection angle of the second deflector in such a way in the first mode of operation that the produced particle beam is directed in a predetermined direction and configured to set the second deflection angle of the second deflector in such a way in the second mode of operation that the produced particle beam is directed in the same predetermined direction. According to exemplary embodiments, the controller is further configured to set the first and the second deflection angle in such a way that a difference between the second deflection angle in the first mode of operation and the second deflection angle in the second mode of operation equals a difference between the first deflection angle in the first mode of operation and the first deflection angle in the second mode of operation.

According to exemplary embodiments, the first deflector provides an electric and/or magnetic focusing lens field in order to focus the first beam and the second beam together.

According to exemplary embodiments, the second deflector is arranged at a small distance from the second plate, as seen in the direction of the beam path. By way of example, the distance between the principal plane of the second deflector and a surface of the second plate facing the particle emitter is less than 5 mm. Here, as seen in the direction of the beam path, the principal plane of the second deflector can lie upstream or downstream of the surface of the second plate facing the particle emitter.

According to exemplary embodiments, the particle source further includes a particle-optical lens having a principal plane, which is arranged in the beam path downstream of the first plate. By way of example, the particle-optical lens can be produced by a magnetic field which, in turn, is produced by one or more coils through which a current flows. The geometry of the coils determines the profile of the focusing magnetic field produced along the beam path. The principal plane of the particle-optical lens can be determined according to the conventional definition for lenses in optics. The principal plane of the particle-optical lens lies in the beam path downstream of the first plate and it can lie, in particular, between the first plate and the second plate or else in the beam path downstream of the second plate.

According to exemplary embodiments, the particle source further includes a third plate that is arranged in the beam path downstream of the second plate and downstream of the principal plane of the particle-optical lens and that has a fourth aperture, through which particles of the produced particle beam pass through third plate. This third plate can also have a plurality of fourth apertures that differ in terms of their diameter. The beam can be alternatively directed to one of the plurality of fourth apertures in order to produce beams with different diameters in the beam path downstream of the third plate. To this end, the third plate can be displaced relative to the remaining components of the particle source via an actuator, for example, or the beam can be deflected via deflectors in such a way that it is incident on a selected one of the plurality of fourth apertures.

The controller can be further configured to set a refractive power of the particle-optical lens in such a way that the produced particle beam has a beam focus at a location which, as seen in the direction of the beam path, has a distance that is less than 5 mm from a surface of the third plate facing the particle emitter. Here, the beam focus can lie in the beam path upstream or downstream of the third plate.

If the particle source is used in a particle-optical system, the at least one aperture in the third plate can be used as an aperture stop of the system. Further, the particle-optical lens can be used as a condenser lens if the particle source is used in a particle-optical system.

According to exemplary embodiments, the cross-sectional area of the third aperture in the second plate is greater than the cross-sectional area of the first aperture in the first plate. Here, it is possible that all particles of the first divergent beam pass through the aperture in the second plate in the first mode of operation.

According to exemplary embodiments, the particle source is configured in such a way that all particles of the second divergent beam pass through the third aperture in the second plate in the second mode of operation.

According to exemplary embodiments, the particle source does not have, along the beam path, a deflector whose principal plane is arranged between the particle emitter and the first plate. Likewise, according to exemplary embodiments, the particle source does not have a particle-optical lens that provides a magnetic field that focuses a particle beam and whose principal plane, as seen along the beam path, is arranged between the particle emitter and the first plate.

Embodiments of the disclosure further provide a particle-optical apparatus that includes a particle source according to one of the embodiments explained above and a particle-optical lens that is configured to focus on an object the particle beam produced by the particle source. By way of example, the particle-optical apparatus can be an electron microscope, an ion microscope, an ion beam appliance for modifying objects, for example by ion beam etching, a lithography appliance that operates with electrons or ions, or the like.

BRIEF DESCRIPTION OF THE FIGURES

The disclosure is explained in more detail below on the basis of drawings, in which.

DETAILED DESCRIPTION

Figure 1:
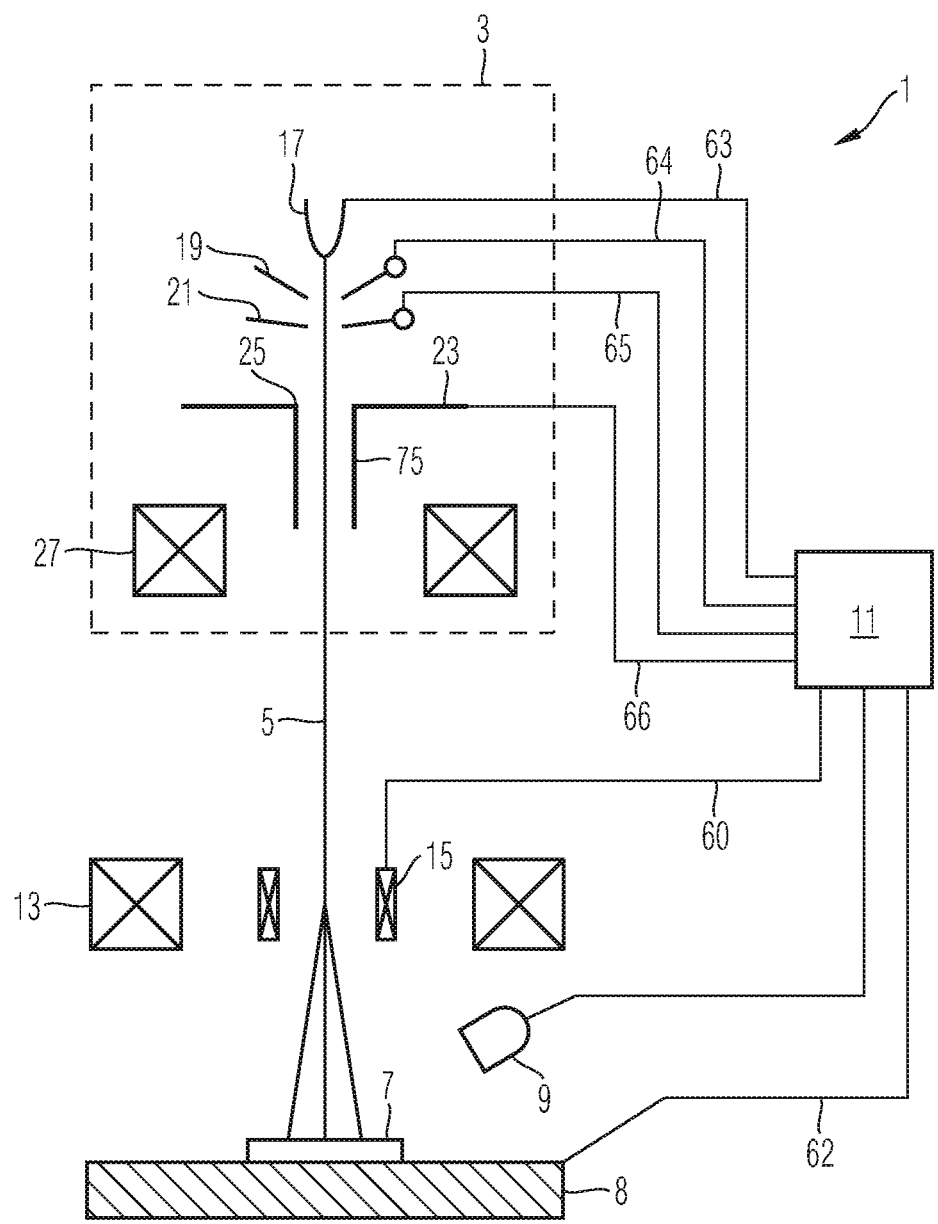
FIG. 1 shows a schematic illustration of a particle beam system.

FIG. 1 shows a particle beam system according to an exemplary embodiment. The particle beam system 1 includes a particle source 3 that produces a particle beam 5. The particle beam 5 emanating from the particle source 3 can be directed onto an object 7, for example, which is arranged on an object stage 8. The particles of the particle beam 5 that are incident on the object 7 trigger events that are detected by a detector 9, the detector outputting detection signals to a controller 11 depending on the detected events. The particle beam 5 can be focussed on the surface of the object 7 by way of an objective lens 13. A deflector 15, which is controlled by the controller 11 via a control line 60, deflects the particle beam 5 passing through the deflector 15 through an adjustable deflection angle such that the particle beam 5 can be directed onto any location on the surface of the object 7 within an object field. In particular, the controller can consequently scan the particle beam 5 over the surface of the object 7 and store detection signals that are assigned to the locations on the surface of the object 7 on which the particle beam 5 is currently directed. These stored signals represent an electron-microscopic image of the scanned part of the surface of the object 7. The controller 11 controls the electrical potentials of the various components of the particle beam system 1. Below, the assumption is made that the ground potential for the description of the various potentials is the usual reference potential and that the object stage 8 is kept at the reference potential by the controller 11 via a line 62 or any other electrical connection.

The particle source 3 includes a particle emitter 17 which, for example, can be embodied as a Schottky emitter that produces electrons by field-assisted thermal emission. The particle emitter 17 is controlled by the controller 11 via a control line 63 and it is kept at a potential that can lie between −0.02 kV and −30 kV, for example. The particle source 3 further includes a suppressor electrode 19 that is kept at a potential that can lie +300 V under the potential of the particle emitter 17, for example, by the controller 11 via a control line 64. The particle source 3 further includes an extractor electrode 21 in order to extract charged particles from the particle emitter 17, the charged particles forming the particle beam 5. The extractor electrode 21 is kept at a potential that can lie 2 to 4 kV over the potential of the particle emitter 17, for example, by the controller 11 via a control line 65. The particle source 3 further includes an anode 23 that has an aperture 25 and that is kept at a potential that can be +8 kV, for example, by the controller 11 via a control line 66. A potential difference between the particle emitter 17 and the anode 23 determines the kinetic energy of the particles of the beam 5 that pass through the aperture 25 in the anode 23. The anode 23 can be adjoined by a beam tube 75 that extends to the object stage and forms a field-free drift path for the beam 5.

A condenser lens 27 is arranged in the beam path downstream of the anode 23 in order to collimate the particle beam 5.

Figure 2:
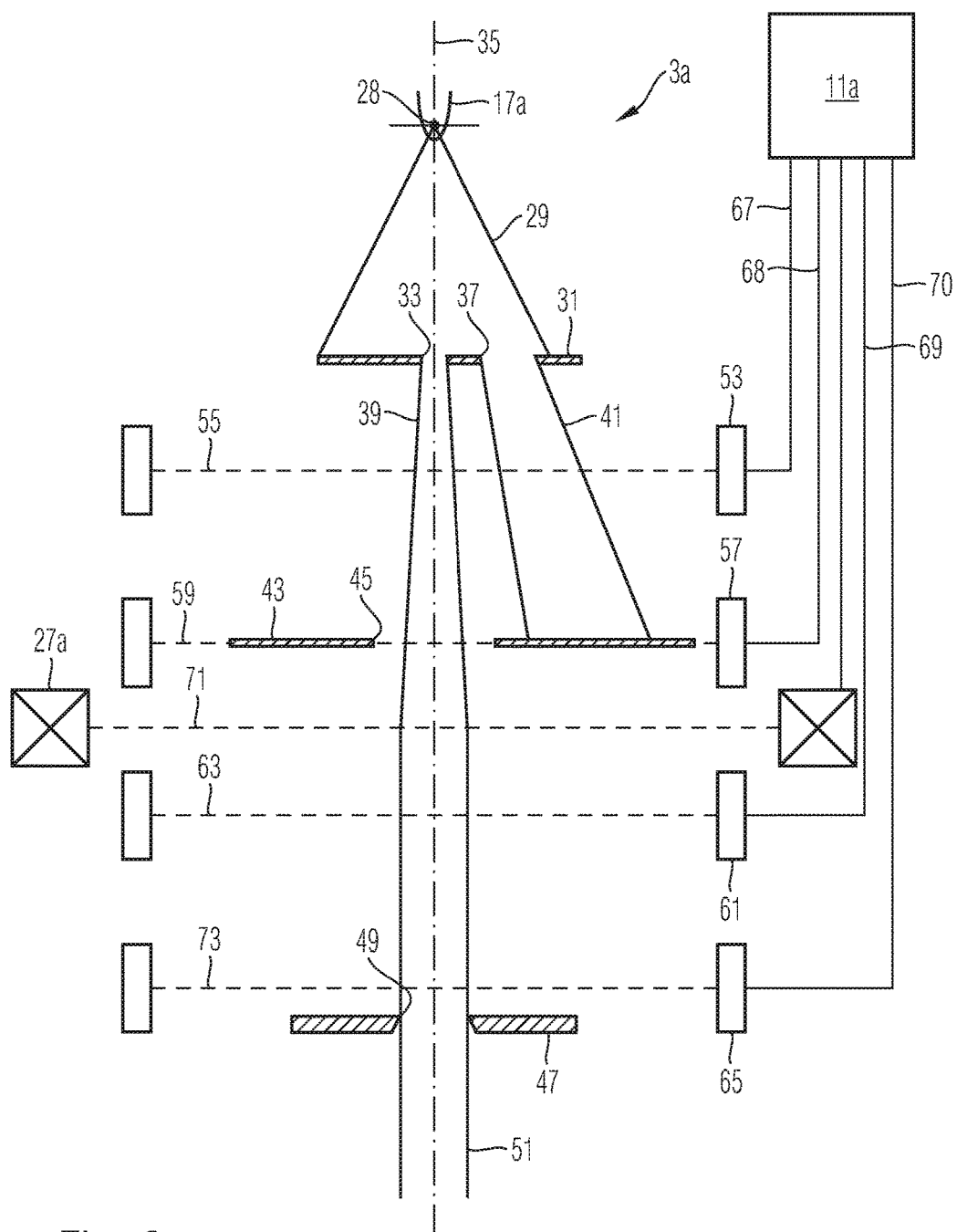
FIG. 2 shows a particle source that can be used in the particle beam system of FIG. 1, in a first mode of operation.

Details of an embodiment of a particle source that can be used in the particle beam system of FIG. 1 are explained below on the basis of FIGS. 2 to 3. FIG. 2 shows a schematic illustration of a beam path and components of a particle source 3a. The particle source 3a includes a controller 11a and a particle emitter 17a. The particle emitter 17a is operated by the controller 11a; i.e., the controller 11a supplies a current, for example, to the particle emitter 17a in order to heat the latter and it supplies a suitable potential, for example a high-voltage potential, to the particle emitter 17a. For the purposes of extracting particles from the particle emitter 17a, the particle source 3a can have suppressor and extractor electrodes, although these are not depicted in FIG. 2. Particles extracted from the particle emitter 17a form a diverging beam 29 of charged particles. By way of a suitable design of the particle emitter 17a and of electrodes, such as extractor and suppressor electrodes, for example, and by applying suitable electric potentials thereto, it is possible to make the diverging particle beam 29 appear as coming from a punctiform virtual source 28.

Figure 4:
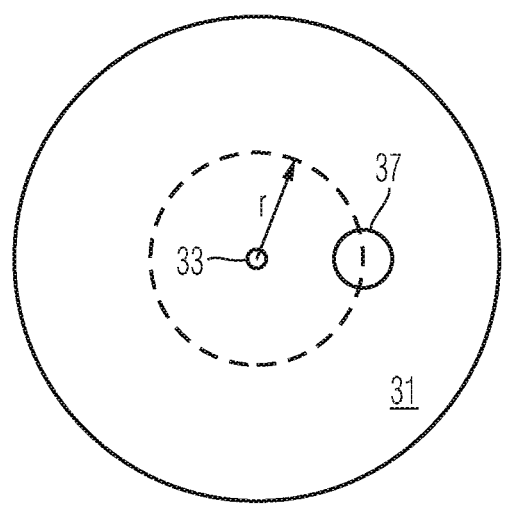
FIG. 4 shows a plate with apertures that can be used in the particle source of FIGS. 2 and 3.

The diverging beam 29 is incident on a first plate 31, which is illustrated in a cross section in FIG. 2 and which is illustrated in a plan view in FIG. 4. The plate 31 has a first central aperture 33, the centre of which is arranged on an optical axis 35 of the particle source 3a. Further, the first plate 31 has a second aperture 37, the centre of which is arranged at a distance r from the optical axis 35.

Some of the particles of the diverging beam 29 are incident on the surface of the first plate 31 facing the particle emitter 17a and some pass through the first plate 31 through the apertures 33 and 37. The particles of the diverging beam 29 passing through the apertures 33 and 37 form a first beam 39 and a second beam 41, respectively, in the beam path downstream of the first plate. The beam 39 made of the particles passing through the first aperture 33 in the first plate 31 has a smaller beam cross section than the beam 41 that is formed from the particle passing through the second aperture 37 since the cross-sectional areas of the apertures 33 and 37 also differ. By way of example, the assumption is made that the cross-sectional area of the second aperture 37 is five times larger than the cross-sectional area of the first aperture 33. Under the assumption that the flux of particles passing through the apertures 33 and 37 is proportional to the cross-sectional areas of these openings, the beam current of the beam 41 is five times larger than the beam current of the beam 39.

A second plate 43 is arranged in the beam path downstream of the first plate 31, the second plate having an aperture 45 whose centre is arranged on the optical axis 35. The cross-sectional area of the aperture 45 is substantially larger than the cross-sectional area of the aperture 33, and so all particles of the beam 39 pass through the aperture 45.

Since the beam 29 that is incident on the plate 31 is divergent, the beam 39 formed by the aperture 33 is also divergent. In order to collimate this beam, provision is made of a particle-optical lens 27a as a condenser lens. In the setting explained on the basis of FIG. 2, the particle-optical lens 27a is excited in such a way that the beam 39 is collimated substantially parallel after passing through the lens 27a and the beam passes through an aperture stop that is formed by a third plate 47 that has an aperture 49, the centre of which once again lies on the optical axis 35 of the particle source 3a. Further, the excitation of the lens 27 is set in such a way that the cross section of the beam 39 in the plane of the third plate 47 is slightly larger than the cross-sectional area of the aperture 49 so that not all particles of the beam 39 can pass through the third plate 47 through the aperture 49 and the cross-sectional area of the aperture 49 defines the cross section of the particle beam 51 that passes through the third plate 47, the particle beam being the particle beam that is output by the particle source 3a.

Consequently the particle source 3a explained on the basis of FIG. 2 produces a particle beam 51 from the beam 39 which, in comparison with the beam 41, has the smaller beam current. The beam 41 is incident on the surface of the plate 43, without passing through the aperture 45 thereof. The mode of operation of the particle source 3a shown in FIG. 2, in which the particle beam 51 produced by the particle source is formed by the beam 39 with the lower beam current, is a first mode of operation of the particle source 3a. A second mode of operation of the particle source 3a is explained below on the basis of FIG. 3.

The particle source 3a includes a first deflector 53, the principal plane 55 of which is arranged in the beam path between the first plate 31 and the second plate 43. While the beams 39 and 41 pass through the deflector 53 without being deflected in the first mode of operation (see FIG. 2), the deflector 53 is excited by the controller 11a via a control line 67 in the second mode of operation in such a way that it deflects the beams 39 and 41 by a deflection angle α in each case. To this end, the deflector 53 is configured in such a way that it provides a magnetic dipole field, an electric dipole field or a combination of a magnetic dipole field and an electric dipole field in a spatial region through which the beams 39 and 41 pass. The strength of the provided dipole field, which is controlled by the controller 11a, determines the deflection angle α, which is experienced by the two beams 39 and 41 when they pass through the deflector 53. The absolute value of the deflection angle α and the orientation thereof in the circumferential direction about the optical axis 35 are selected in such a way that the beam 39 is incident on the surface of the second plate 43 without passing through the aperture 45 thereof and that the particles of the beam 41, in the entirety thereof or at least to a great extent, pass through the aperture 45 in the plate 43.

The particle source 3a further includes a second deflector 57 that is controlled by the controller 11a via a control line 68, the principal plane 59 of the second deflector being arranged at a distance from the principal plane 55 of the deflector 53 in the beam direction. The second deflector 57 likewise provides a magnetic and/or electric dipole field and it is excited by the controller 11a in such a way that it deflects the beam 41 through a second deflection angle β that is dimensioned in such a way that the beam 41, after the deflection by the second deflector 57, is oriented in the same direction as the beam 51 in the first mode of operation, i.e. along the optical axis 35 in the example explained on the basis of FIGS. 2 and 3. Other directions are possible.

In the second mode of operation, the lens 27a is excited more strongly by the controller 11a than in the first mode of operation so that the beam 41, which has the larger beam cross section in comparison with the beam 39, for the most part can also pass through the aperture 49 in the third plate 47 after passing through the second plate 43 through the aperture 45 thereof. Here too, the excitation of the lens 27a is set in such a way that some of the particles of the beam 41 do not pass through the aperture 49 in the third plate 47, and so the cross-sectional area of this aperture 49 defines the cross section of the particle beam 51 produced by the particle source 3a in the second mode of operation.

Figure 3:
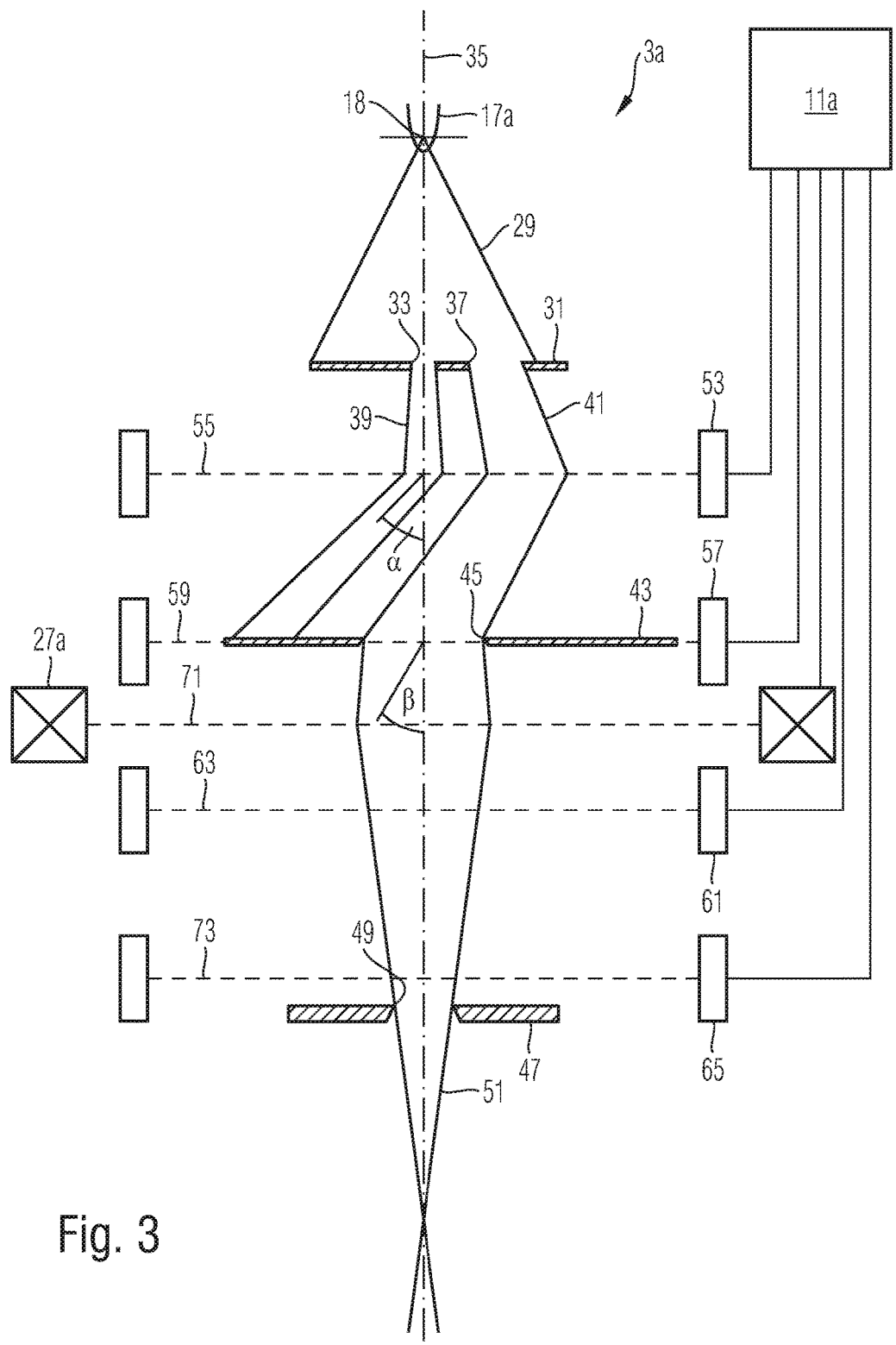
FIG. 3 shows the particle source of FIG. 2 in a second mode of operation.

In the embodiment explained on the basis of FIGS. 2 and 3, the principal plane 59 of the second deflector 57 coincides with the plane of the second plate 43. However, this is not necessary. The principal plane 59 of the second deflector 57 can be arranged in the beam path upstream or downstream of the second plate 43.

The particle source 3a further includes a third deflector 61 with a principal plane 63, the third deflector being controlled by the controller 11a via a control line 69, and a fourth deflector 65 with a principal plane 73, the fourth deflector being controlled by the controller 11a via a control line 70. The principal planes 63 and 73 of the third and fourth deflector 61, 65, respectively, are arranged at a distance from one another along the beam path. The deflectors 61 and 65 are able to each provide a magnetic and/or electric dipole field, are controlled by the controller 11a and are able to be used to deflect the particles of the beams passing therethrough such that the particle beam 51 produced by the particle source 3a extends exactly in the direction of the optical axis 35 and it is also exactly centred thereon.

In the example explained on the basis of FIGS. 2 and 3, the principal planes 63 and 73 of the third and fourth deflector 61, 65, respectively, are arranged in the beam path upstream of the third plate 47. Other arrangements are possible. Both principal planes 63 and 73 can be arranged in the beam path downstream of the plate 47 and the plate 47 can also be arranged in the beam path between the two principal planes 63 and 73.

A principal plane 71 of the lens 27 is arranged in the beam path downstream of the second plate 43 in the example explained on the basis of FIGS. 2 and 3. This need not necessarily be the case, as will be explained below in an embodiment that is explained on the basis of FIGS. 5 and 6. A particle source 3b shown in FIGS. 5 and 6 has a structure that is very similar to the particle source that was explained on the basis of FIGS. 2 to 4. Thus, the particle source 3b includes a particle emitter 17*b* that emits a divergent beam 27*b* that is incident on a first plate 31*b* having a small aperture 33*b*, the centre of which is arranged on an optical axis 35*b* of the particle source 3*b*. Further, the first plate 31*b* includes a second aperture 37*b*, the centre of which is arranged at a distance from the optical axis 35*b*. In the beam path downstream of the first plate 31*b*, the particles of the diverging beam 27*b* passing through the apertures 33*b* and 37*b* produce beams 39*b* and 41*b*.

Figure 5:
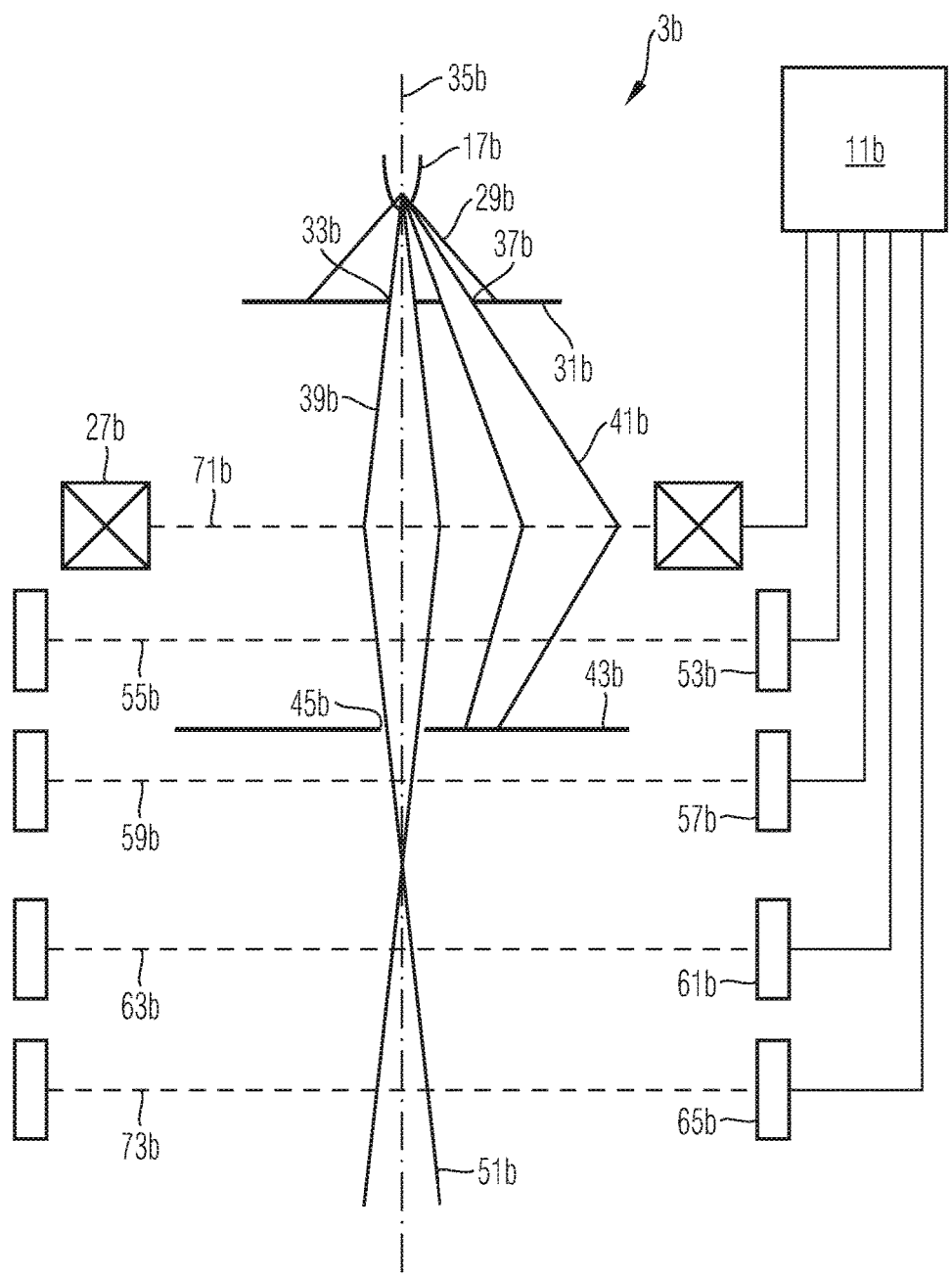
FIG. 5 shows a particle source that can be used in the particle beam system of FIG. 1, in a first mode of operation.

In a first mode of operation shown in FIG. 5, the beam 39*b* passes through an aperture 45*b* in a second plate 43*b* and forms the particle beam 51*b* that is produced by the particle source 3*b* in the first mode of operation.

A principal plane 71*b* of a particle-optical lens 27*b* for collimating the beam 39*b* lies between the first plate 31*b* and the second plate 43*b*.

Figure 6:
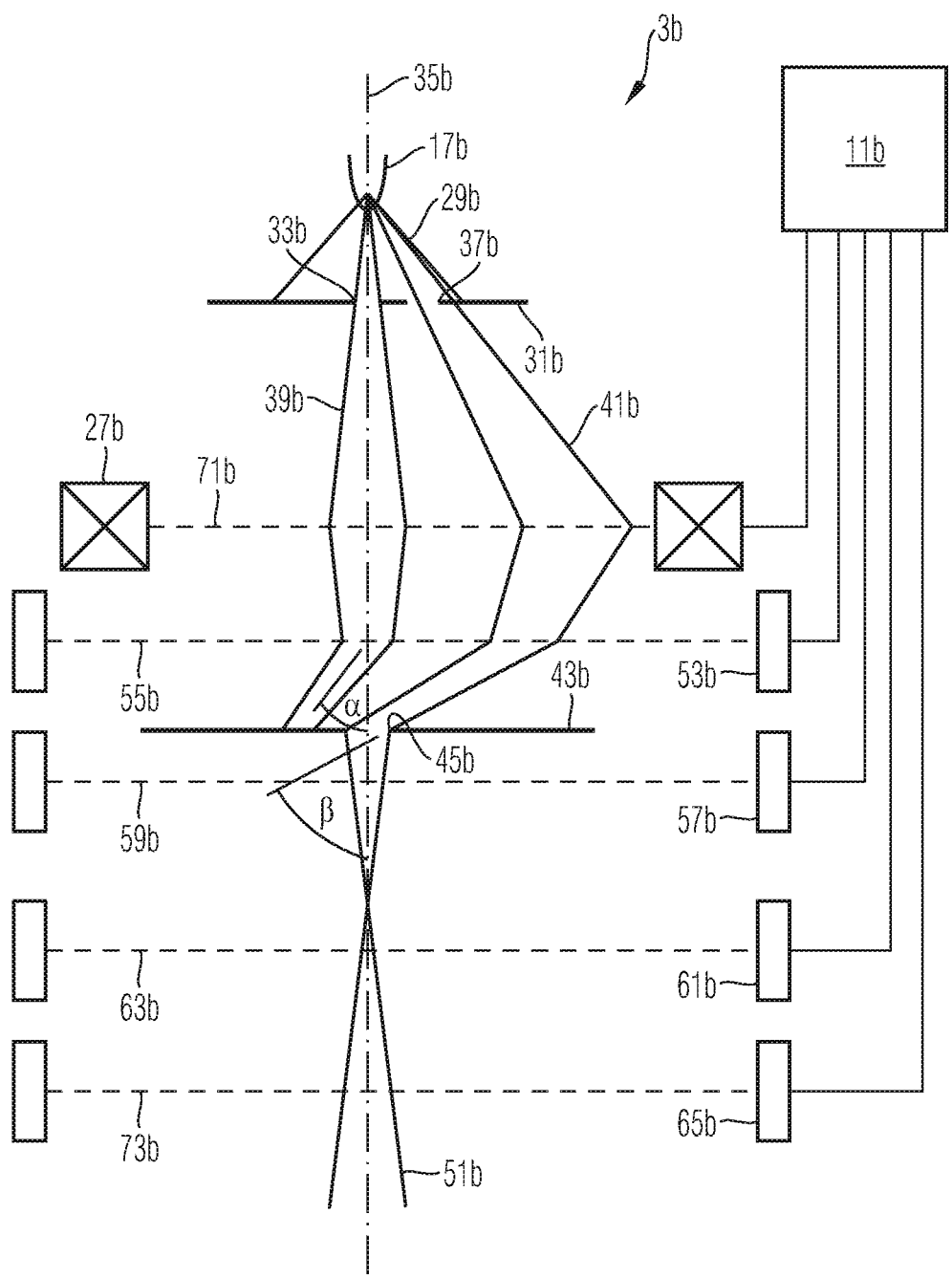
FIG. 6 shows the particle source of FIG. 5 in a second mode of operation.

In a second mode of operation, shown in FIG. 6, a beam deflector 53*b*, which can provide a magnetic and/or electric dipole field and whose principal plane 55*b* is arranged between the first plate 31*b* and the second plate 43*b*, is excited in such a way that the particles of the first beam 39*b* are deflected through an angle α such that they are incident on the surface of the second plate 43*b* without passing through the aperture 45*b* thereof. At the same time, the particles of the second beam 41*b* are likewise deflected through this angle such that they pass through the aperture 45*b* of the second plate 43*b* and subsequently provide the particle beam 51*b* that is produced by the particle source 3*b*. The particle source 3*b* further includes a second deflector 57*b* that can provide a magnetic and/or electric dipole field and whose principal plane 59*b* is arranged in the beam path downstream of the principal plane 55*b* of the first deflector 53*b*. The second deflector 57*b* is excited by the controller 11*b* in such a way that the particles of the second beam 41*b* are deflected through an angle β that is dimensioned in such a way that the second beam 41*b* extends parallel to the optical axis 35*b* after the deflection by the second deflector 57*b*. In the illustration of FIGS. 5 and 6, the principal plane 59*b* of the second deflector 57*b* is arranged slightly downstream of the second plate 43*b*. However, it is also possible for the principal plane 59*b* to coincide with the plate 43*b* or for the principal plane 59*b* to be arranged in the beam path upstream of the plate 43*b*.

In the second mode of operation shown in FIG. 6, the particle beam 51*b* produced by the particle source 3*b* is provided by the part of the beam 41*b* passing through the aperture 45*b*. In the case of a sufficiently large aperture 45*b*, the substantive part of the beam 41*b* passes through the aperture 45*b*, and so the particle beam 51*b* that is produced in the second mode of operation has a substantially higher beam current than the particle beam 51*b* that is produced in the first mode of operation and provided by the beam 39*b*.

Further, the particle source 3*b* can include a third deflector 61*b* and a fourth deflector 65*b*, which each are able to provide a magnetic and/or electric dipole field, for example, in order to exactly centre the produced particle beam 51*b* on the optical axis 35*b*.

In the embodiments explained above, the two beams 39 and 41 are produced by the first plate 31 shown in FIG. 4. Here, the smaller aperture 33 is centred with respect to the optical axis of the particle source while the larger aperture 37 is arranged at a distance from this optical axis. This may have the following advantage: If the small beam current produced by the particle source in the first mode of operation is used to achieve a high resolution, the central arrangement of the small aperture 33 is helpful since the particles forming the produced particle beam always run close to the optical axis and, as a result thereof, chromatic aberrations, in particular, are only produced to a small extent. For the beam 41, which passes through the larger aperture 37, larger deflections of the particles arise, also at a distance from the optical axis, which is why chromatic aberrations are produced to a comparatively large extent. However, this beam is not used to obtain a resolution that is as high as possible.

Figure 7:
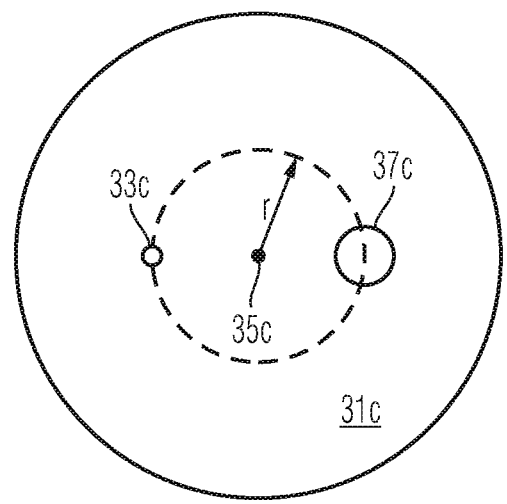
FIG. 7 shows a plate with apertures that can be used in the particle source of FIGS. 2, 3, 5 and 6.

FIG. 7 shows a variant of the plate 31 shown in FIG. 4. The first plate 31*c* shown in FIG. 7 likewise has a small aperture 33*c* and, in comparison with the aperture 33*c*, a larger aperture 37*c*. Both apertures 33*c* and 37*c* are arranged at a distance r from the optical axis 35*c*. The first plate 31*c* can be used in all embodiments of the particle source explained above.

While the beam 39 is not deflected by the first deflector 53 and the second deflector 57 in the first mode of operation when using the plate 31 shown in FIG. 4, a deflection of both beams 39 and 41 occurs in both modes of operation when using the first plate 31*c* shown in FIG. 7 such that the beam 39 passes through the aperture 45 in the second plate 43 in the first mode of operation and the beam passing through the aperture 37*c* passes through the aperture 45 in the second plate 43 in the second mode of operation.

In the exemplary embodiments explained above, a diverging beam of charged particles that is produced by a particle emitter is incident on a first plate with at least two apertures that differ in terms of their cross-sectional areas. As a result of this, at least two beams with different cross sections are formed in the beam path downstream of the first plate. A deflector arranged in the beam path downstream of the first plate is alternatively actuated by a controller in such a way that, in a first mode of operation, a particle beam with a first beam cross section passes through an aperture in a second plate that is arranged in the beam path downstream of the deflector or, in a second mode of operation, a beam with a second cross section passes through the aperture in the second plate. In the embodiments described above, this deflector provides an adjustable magnetic and/or electric dipole field. However, this need not be the case. According to other embodiments, this deflector provides a magnetic or electric deflection field that has a different symmetry to the symmetry of a dipole field. In the exemplary embodiment described below on the basis of FIGS. 8 and 9, this beam deflector has a configuration such that the deflection field is a magnetic and/or electric focusing lens field which has an axial symmetry.

Figure 8:
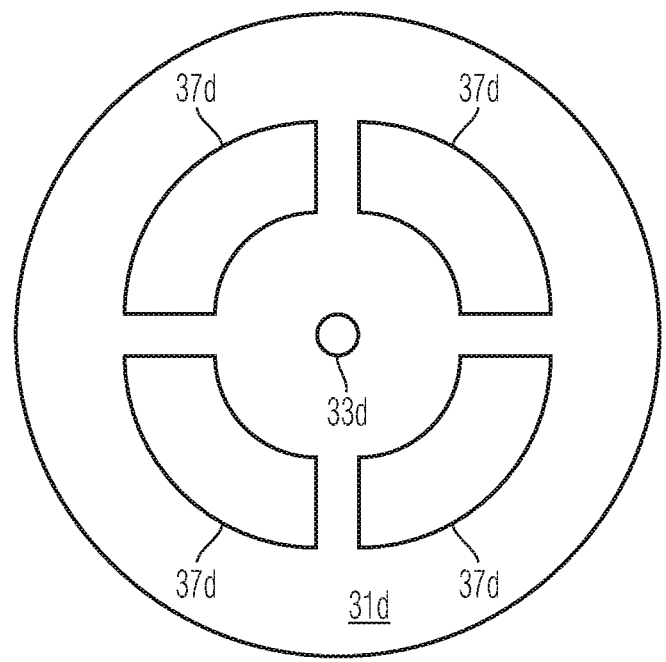
FIG. 8 shows a further plate with an aperture that can be used in a particle source.
Figure 9:
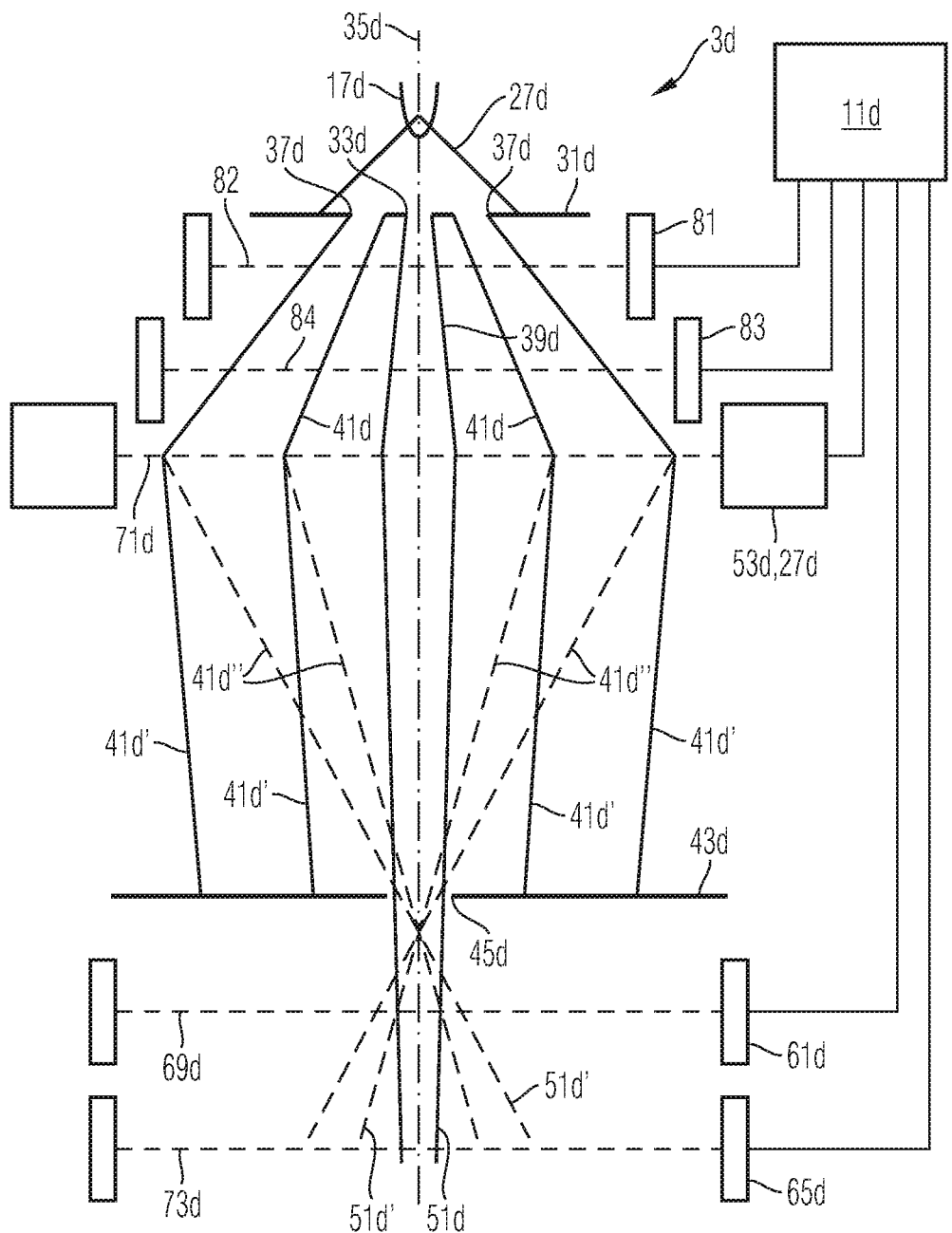
FIG. 9 shows a particle source in which the aperture shown in FIG. 8 can be used.

The embodiment described on the basis of FIGS. 8 and 9 further differs from the embodiments described above in that the first plate, on which the diverging beam that is produced by the particle emitter is incident, does not only have a single first opening and a single second opening that differ in terms of the cross-sectional areas thereof, but has a plurality of first and/or second apertures.

FIG. 8 shows a plan view, corresponding to FIGS. 4 and 7, on a first plate 31*d* of a particle source 3*d* that is illustrated schematically in FIG. 9. The first plate 31*d* has a centrally arranged first aperture 33*d* with a small cross-sectional area and it has four second apertures 37*d* which, in comparison with the first aperture 33*d*, each have a large cross-sectional area. The four second apertures 37*d* further each have a design that corresponds to a part of a circular ring and they are arranged in such a way that the four parts of circular rings together provide a cross-sectional area that approximates that of a circular ring.

The particle source 3*d* includes a particle emitter 17*d* that emits a divergent beam that is incident on the first plate 31*d*. Particles of the diverging particle beam, which pass through the apertures 33d and 37d in the plate 31d, produce diverging particle beams 39d and 41d in the beam path downstream of the first plate 31d. The cross section of the particle beam 37d is defined by the cross-sectional area of the aperture 33d in the plate 31d and the four second apertures 37d in the first plate 31d produce four particle beams 41d which, together, have a beam cross section that approximates a circular ring cross section.

The particle source 3d further has a condenser lens 27d that is controlled by a controller 11d in order to switch the particle source 3d from a first mode of operation into a second mode of operation, as explained below, and so the condenser lens 27d likewise has the function of a deflector 53d in order to switch the particle source 3d from the first mode of operation into the second mode of operation.

The condenser lens 27d or the deflector 53d can provide an electric and/or magnetic focusing lens field that is symmetric in relation to a principal axis 35d.

In the first mode of operation, the condenser lens 27d or the deflector 53d is weakly excited by the controller 11d such that the beams 41d are deflected comparatively weakly and, as illustrated by solid lines 41d' in FIG. 9, are incident on a second plate 43d without passing through an aperture 45d in the second plate 43d. However, during this weak excitation of the condenser lens 27d or of the deflector 53d, the particle beam 39d is sufficiently collimated such that a substantive part of the particles of the particle beam 39d passes through the aperture 45d in the second plate 43d. These particles of the beam 39d form the beam 51d that leaves the particle source 3d and provides the small beam current in the first mode of operation.

In the second mode of operation, the condenser lens 27d or the deflector 53d is excited more strongly by the controller 11d, and so the beams 41d are deflected so strongly that they are focussed in the vicinity of the second plate 43d and, for the most part, pass through the aperture 45d in the second plate 43d, as illustrated in FIG. 9 by broken lines 41d". The particles of the beams 41d" that pass through the aperture 45d then form a particle beam 51d' with a large beam current, which leaves the particle source 3d, in the second mode of operation.

The particle source 3d can further include a first deflector 81 with a principal plane 82, which is arranged between the first plate 31d and a principal plane 71d of the condenser lens 27d or the deflector 53d. Further, provision can be made for a second deflector 83, the principal plane 84 of which is arranged between the principal plane 82 of the first deflector 81 and the principal plane 71d of the condenser lens 27d or of the deflector 53d. The two deflectors 81 and 83 can each provide dipole fields and can be actuated by the controller 11d in order to align the beam 39d and the beams 41d in such a way that these pass through the principal plane 71d of the condenser lens 27d or of the deflector 53d in such a way that they are aligned symmetrically with respect to the principal axis 35d, in respect of which the focusing lens field provided by the condenser lens 27d or the deflector 53d is also symmetric.

The particle source 3d can further include a third deflector 61d, with a principal plane 63d, that is controlled by the controller 11d and a fourth deflector 65d, with a principal plane 73d, that is controlled by the controller 11d, the deflectors each providing a magnetic and/or electric dipole field and being able to be used to deflect the particles of the beams passing therethrough in such a way that the particle beam 51d that is produced by the particle source 3d extends exactly in the direction of the axis 35d and is also exactly centred thereon.

What is claimed is:

1. A particle source, comprising:
a controller;
a particle emitter;
a first plate;
a first deflector; and
a second plate;
wherein:
the particle emitter is configured to produce a diverging beam of charged particles;
the particle emitter, the first plate, the first deflector and the second plate are arranged consecutively in this sequence along a beam path of the charged particles;
the first plate has first and second apertures arranged in a beam path of the diverging beam and through which charged particles of the diverging beam pass through the first plate;
the first aperture has a first cross-sectional area;
the second aperture has a second cross-sectional area greater than the first cross-sectional area;
the particles of the diverging beam that pass through the first and second apertures form a first and a second beam downstream of the first plate;
the second plate has a third aperture through which charged particles of the first and the second beams pass through the second plate;
the first deflector is configured to deflect the first and second beams;
in a first mode of operation, the controller is configured to set the first deflector so that particles of the first beam pass through the third aperture and form the particle beam produced by the particle source while particles of the second beam do not pass through the second plate; and
in a second mode of operation, the controller is configured to set this first deflector so that particles of the second beam pass through the third aperture and form the particle beam produced by the particle source while the particles of the first beam do not pass through the second plate.

2. The particle source of claim 1, wherein the first deflector is configured to provide an electric and/or magnetic dipole field to deflect the first and second beams together through a first deflection angle.

3. The particle source of claim 2, further comprising a second deflector downstream of the first deflector along the beam path, wherein the second deflector is configured to deflect the particles of the first and the second particle beams by an adjustable second deflection angle.

4. The particle source of claim 3, wherein the controller is configured to set the second deflection angle of the second deflector in such a way in the first mode of operation that the produced particle beam is directed in a predetermined direction and configured to set the second deflection angle of the second deflector in such a way in the second mode of operation that the produced particle beam is directed in the same predetermined direction.

5. The particle source of claim 3, wherein the controller is configured to set the first and second deflection angles so that a difference between the second deflection angle in the first mode of operation and the second deflection angle in the second mode of operation equals a difference between the first deflection angle in the first mode of operation and the first deflection angle in the second mode of operation.

6. The particle source of claim 2, further comprising a third plate in the beam path, wherein the third plate has a fourth aperture through which particles of the produced particle beam pass through the third plate.

7. The particle source of claim 6, wherein a refractive power of the particle-optical lens is adjustable by the controller, and the controller is configured to set the refractive power of the particle-optical lens so that the produced particle beam has a beam focus at a location which, as seen in the direction of the beam path, has a distance that is less than 5 mm from a surface of the third plate facing the particle emitter.

8. The particle source of claim 1, wherein the first deflector is configured to provide an electric and/or magnetic focusing lens field to focus the first beam and the second beam together.

9. The particle source of claim 1, wherein a principal plane of the second deflector, as seen in the direction of the beam path, is arranged at a distance that is less than 5 mm from a surface of the second plate facing the particle emitter.

10. The particle source of claim 1, further comprising a particle-optical lens having a principal plane in the beam path downstream of the first plate.

11. The particle source of claim 10, wherein the principal plane of the particle-optical lens is in the beam path downstream of the second plate.

12. The particle source of claim 10, wherein the principal plane of the particle-optical lens is in the beam path between the first and second plates.

13. The particle source of claim 10, further comprising a third plate in the beam path downstream of the second plate and downstream of the principal plane of the particle-optical lens, wherein the third plate has a fourth aperture through which particles of the produced particle beam pass through the third plate.

14. The particle source of claim 13, wherein a refractive power of the particle-optical lens is adjustable by the controller, and the controller is configured to set the refractive power of the particle-optical lens so that the produced particle beam has a beam focus at a location which, as seen in the direction of the beam path, has a distance that is less than 5 mm from a surface of the third plate facing the particle emitter.

15. The particle source of claim 1, wherein the cross-sectional area of the third aperture in the second plate is greater than the cross-sectional area of the first aperture in the first plate.

16. The particle source of claim 1, wherein the particle source is configured so that, in the first mode of operation, all particles of the first beam pass through the third aperture.

17. The particle source of claim 1, wherein the particle source is configured so that, in the second mode of operation, some of the particles of the second beam are incident on the second plate and do not pass through the third aperture.

18. The particle source of claim 1, wherein the particle source is free from a deflector configured to deflect particles of a particle beam by an adjustable deflection angle and that, as seen along the beam path, is arranged between the particle emitter and the first plate.

19. The particle source of claim 1, wherein the particle source is free from a particle-optical lens configured to provide a magnetic field that focuses a particle beam, the principal plane of the lens, as seen along the beam path, being arranged between the particle emitter and the first plate.

20. A particle-optical apparatus, comprising:
   a particle source according to claim 1; and
   a particle-optical lens configured to focus the particle beam on an object.

* * * * *